United States Patent
Toyoda et al.

(10) Patent No.: US 8,938,878 B2
(45) Date of Patent: Jan. 27, 2015

(54) METHOD FOR MANUFACTURING ELECTRONIC PARTS DEVICE AND RESIN COMPOSITION FOR ELECTRONIC PARTS ENCAPSULATION

(75) Inventors: Eiji Toyoda, Osaka (JP); Shigetomi Kido, Mie (JP)

(73) Assignee: Nitto Denko Corporation, Osaka (JP)

(*) Notice: Subject to any disclaimer, the term of this patent is extended or adjusted under 35 U.S.C. 154(b) by 789 days.

(21) Appl. No.: 13/225,681

(22) Filed: Sep. 6, 2011

(65) Prior Publication Data
US 2012/0055015 A1   Mar. 8, 2012

(30) Foreign Application Priority Data
Sep. 6, 2010   (JP) ................... 2010-198623

(51) Int. Cl.
*H05K 3/30*   (2006.01)
*H01L 21/56*   (2006.01)
*H01L 23/29*   (2006.01)
*H01L 23/31*   (2006.01)
*H01L 23/00*   (2006.01)

(52) U.S. Cl.
CPC .............. *H01L 21/56* (2013.01); *H01L 21/561* (2013.01); *H01L 21/563* (2013.01); *H01L 23/293* (2013.01); *H01L 23/295* (2013.01); *H01L 23/3121* (2013.01); *H01L 24/75* (2013.01); *H01L 2224/73203* (2013.01); *H01L 2924/10253* (2013.01)
USPC ................................ 29/841; 29/832; 438/127

(58) Field of Classification Search
CPC ..... H01L 21/50; H01L 21/561; H01L 23/293; H01L 23/295; H01L 23/3121; H01L 24/75
USPC ................... 29/830–832, 841, 846, 848, 849; 257/723, 787–790; 310/340, 344; 428/212, 500, 521; 438/124, 126, 127
See application file for complete search history.

(56) References Cited

U.S. PATENT DOCUMENTS

| | | | |
|---|---|---|---|
| 5,641,997 A | 6/1997 | Ohta et al. | |
| 6,590,070 B1* | 7/2003 | Toriumi et al. | 428/500 |
| 7,239,068 B2* | 7/2007 | Miyaji | 310/344 |
| 7,906,860 B2* | 3/2011 | Meyer et al. | 257/790 |
| 8,034,667 B2* | 10/2011 | Shinoda et al. | 438/127 |
| 2002/0089067 A1 | 7/2002 | Crane et al. | |
| 2004/0213973 A1* | 10/2004 | Hara et al. | 428/212 |
| 2005/0205996 A1 | 9/2005 | Usui et al. | |
| 2005/0218517 A1 | 10/2005 | Capote et al. | |
| 2009/0108440 A1 | 4/2009 | Meyer et al. | |

FOREIGN PATENT DOCUMENTS

| | | |
|---|---|---|
| EP | 0771023 A2 | 5/1997 |
| JP | 2003-17979 A | 1/2003 |

(Continued)

OTHER PUBLICATIONS

Extended European Search Report, dated Jan. 24, 2012, issued by the European Patent Office in corresponding European Application No. 11180025.6.

(Continued)

*Primary Examiner* — Donghai D Nguyen
(74) *Attorney, Agent, or Firm* — Sughrue Mion, PLLC

(57) ABSTRACT

A method for manufacturing an electronic parts device allowing for easy overmolding and underfilling without requiring a jig for preventing leakage of the melted resin composition, and a resin composition sheet for electronic parts encapsulation used therein.

10 Claims, 3 Drawing Sheets

(56) References Cited

FOREIGN PATENT DOCUMENTS

| | | |
|---|---|---|
| JP | 2004-327623 A | 11/2004 |
| JP | 2006-19714 A | 1/2006 |

OTHER PUBLICATIONS

Communication from the European Patent Office issued Apr. 11, 2014 in a counterpart European Application No. 11180025.6.

* cited by examiner

The present invention relates to a method for manufacturing an electronic parts device allowing for easy overmolding and underlining, and a resin composition sheet for electronic parts encapsulation used therein.

BACKGROUND OF THE INVENTION

Conventionally, encapsulation of electronic parts such as semiconductor element, capacitor and resistive element disposed on a package substrate has been performed, for example, by transfer molding with a powdered epoxy resin composition or by potting, dispensing or printing with a liquid epoxy resin composition, a silicone resin or the like. Also, in recent years, sheet molding using a resin composition sheet has been also proposed as a more inexpensive and simpler encapsulation method (see, Patent Documents 1 to 3).

Patent Document 1: JP-A-2004-327623
Patent Document 2: JP-A-2003-17979
Patent Document 3: JP-A-2006-19714

SUMMARY OF THE INVENTION

In the encapsulation using such a resin composition sheet, a sheet material is disposed on electronic parts and hot-pressed, whereby overmolding and underfilling are preformed. However, depending on the encapsulation conditions, the melted resin composition may leak out to contaminate the package substrate, the press or the like or cause a filling failure of an underfill. As a countermeasure therefor, for example, a jig far preventing leakage is attached, but this countermeasure requires changing the jig according to the size or shape of the electronic parts and has a problem in the productivity.

The present invention has been made under these circumstances, and an object of the present invention is to provide a method for manufacturing an electronic parts device allowing for easy overmolding and underfilling without requiring a jig for preventing leakage of the melted resin composition, and a resin composition sheet for electronic parts encapsulation used therein.

Namely, the present invention relates to the following items 1 to 10.

1. A method for manufacturing an electronic parts device, the method including:

a step of disposing a plurality of electronic parts in an array on a package substrate, and then stacking, in order, a thermosetting resin composition sheet shown in (B) below (sheet B) and a thermosetting resin composition sheet shown in (A) below (sheet A) on an electronic parts-mounting area of the package substrate while arranging the center and XY-plane direction of the electronic parts-mounting area to substantially agree with the centers and XY-plane directions of both the sheets A and B;

a step of heating the package substrate which holds this arrangement state at a molding temperature selected from the range of 70 to 150° C. in a chamber under reduced pressure, thereby causing an end part of an entire circumference of the sheet A to be softened and sag into contact with the package substrate and tightly closing a space surrounded by the entire circumference of the sheet A;

a step of, in the sagged state, pressing the sheet A covering the sheet B and the electronic parts;

a step of releasing the pressure in the chamber to perform underfilling of the electronic parts by a melt of the sheet B in the closed space formed between the sheet A and the package substrate;

a step of, after the underfilling, thermally curing the resin compositions of both the sheets A and B to obtain an electronic parts device assembly where the plurality of electronic parts on the package substrate are resin-encapsulated; and a step of dicing the electronic parts device assembly to obtain each discrete electronic parts device:

(A) a thermosetting resin composition sheet having a viscosity at the molding temperature of from 2,000 to 50,000 Pa·s and having a dimension satisfying the following condition (1):

$$Ax > P + 8$$

$$Ay > Q + 8 \quad \text{<Condition (1)>}$$

in which Ax is a length (mm) in an X-axis direction of the sheet A, Ay is an length (mm) in a Y-axis direction of the sheet A, P is a length (mm) in an X direction of the electronic parts-mounting area, and Q is a length (mm) in a Y direction of the electronic parts-mounting area, (B) a thermosetting resin composition sheet having a viscosity at the molding temperature of from 20 to 250 Pa·s and having a dimension satisfying the following condition (2):

$$Ax \geq Bx > P \times 0.8$$

$$Ay \geq By > Q \times 0.8 \quad \text{<Condition (2)>}$$

in which Bx is a length (mm) in an X-axis direction of the sheet B, By is a length (mm) in a Y-axis direction of the sheet B, P is the length (mm) in the X direction of the electronic parts-mounting area, Q is the length (mm) in the Y direction of the electronic parts-mounting area, Ax is the length (mm) in the X-axis direction of the sheet A, and Ay is the length (mm) in the Y-axis direction of the sheet A.

2. The method for manufacturing an electronic parts device according to item 1, in which the dimension of the sheet A satisfies the following condition (1'):

$$t1 + t2 + 40 + P > Ax > t1 + t2 + 8 + P$$

$$t1 + t2 + 40 + Q > Ay > t1 + t2 + 8 + Q$$

$$(t1 + 0.5) - [(n \times Vc)/(P \times Q)] > Az > t1 - [(n \times Vc)/(P \times Q)] \quad \text{<Condition (1')>}$$

in which Ax is the length (mm) in the X-axis direction of the sheet A, Ay is the length (mm) in the Y-axis direction of the sheet A, Az is a thickness (mm) of the sheet A, t1 is a thickness (mm) of electronic parts, t2 is a height (mm) of the electrode part for connection of the electronic part, P is the length (mm) in the X direction of the electronic parts-mounting area, Q is the length (mm) in the Y direction of the electronic parts-mounting area, Vc is a volume (mm³) per one electronic part, and n is the number of electronic parts encapsulated.

3. The method for manufacturing an electronic parts device according to item 1 or 2, in which the dimension of the sheet B satisfies the following condition (2'):

$$Ax \geq Bx > P \times 0.8$$

$$Ay \geq By > Q \times 0.8$$

$$\{[P \times Q \times (t1 + t2) - n(Vc + Vb)]/(P \times Q)\} + 0.1 > Bz > (t2 \times P \times Q - Vb \times n)/(P \times Q) \quad \text{<Condition (2')>}$$

in which Bx is the length (mm) in the X-axis direction of the sheet B, By is the length (mm) in the Y-axis direction of the sheet B, Bz is a thickness (mm) of the sheet B, t1 is the thickness (mm) of the electronic parts, t2 is the height (mm) of the electrode part for connection of the electronic part, P is the length (mm) in the X direction of the electronic parts-mounting area, Q is the length (mm) in the Y direction of the electronic parts-mounting area, Vb is a total volume (mm$^3$) of bumps (electrode parts for connection) mounted on one electronic part, Vc is the volume (mm$^3$) per one electronic part, n is the number of electronic parts encapsulated, Ax is the length (mm) in the X-axis direction of the sheet A, and Ay is the length (mm) in the Y-axis direction of the sheet A.

4. The method for manufacturing an electronic parts device according to any one of items 1 to 3, in which the reduced pressure in the chamber is in a range of from 0.01 to 5 kPa.

5. The method for manufacturing an electronic parts device according to any one of items 1 to 4, in which the pressing step is performed under a pressure of 50 to 1,000 kPa.

6. The method for manufacturing an electronic parts device according to any one of items 1 to 5, in which a temperature at which both the sheets A and B are thermally cured is a temperature exceeding 150° C.

7. The method for manufacturing an electronic parts device according to any one of items 1 to 6, in which the sheet A is a resin composition sheet including an epoxy resin composition which includes the following components (a) to (d):

(a) an epoxy resin having a viscosity at 25° C. of 1.0 to 10.0 Pa·s, (b) a curing agent, (c) an inorganic filler including the following components (c1) to (c3) in which a total content of the components (c2) and (c3) is from 2 to 60 parts by weight per 100 parts by weight of the component (c1), (c1) an inorganic filler having an average particle diameter of 5 to 20 μm, (c2) an inorganic filler having an average particle diameter of 1 to 3 μm, and (c3) an inorganic filler having an average particle diameter of 0.3 to 0.8 μm, and (d) a flexibility-imparting agent.

8. The method for manufacturing an electronic parts device according to any one of items 1 to 7, in which the sheet B is a resin composition sheet including an epoxy resin composition which includes the following components (e) to (h):

(e) a mixture of an epoxy resin having a softening point of 60 to 130° C. and a liquid epoxy resin, (f) a curing agent, (g) an inorganic filler having an average particle diameter of 0.3 to 3 μm, and (h) a flexibility-imparting agent.

9. A resin composition sheet for electronic parts encapsulation, which is used in the method according to any one of items 1 to 8, in which the resin composition sheet is a sheet set including the sheet A and the sheet B.

10. A resin composition sheet for electronic parts encapsulation, which is used in the method according to any one of items 1 to 8, in which the resin composition sheet is obtained by stacking and integrating the sheet A and the sheet B.

That is, the present inventors have continued intensive studies to solve the above-described problems and conceived the idea of, as described above, using two sheets A and B differing in the viscosity and dimension from each other at a molding temperature (heating temperature) selected from the range of 70 to 150° C. (or a sheet obtained by stacking and integrating the sheets A and B) as a thermosetting resin composition sheet for electronic parts encapsulation. More specifically, in accordance with the electronic parts-mounting area on a package substrate, a sheet B slightly smaller or larger than the area is stacked, a sheet A larger than the area is stacked thereon, and the thus-obtained stack is heated at the above-described molding temperature in a chamber under reduced pressure, as a result, the end part of the entire circumference of the sheet A is softened and sags into contact with the package substrate to produce a state of the sheet A covering the sheet B and the electronic parts (see, FIG. 3A). At this time, the sheet A forms a closed space between the sheet and the package substrate by its covering, and the sheet B turns into a low-viscosity gel in the closed space. In this state, when a press plate is pressed against the sheet A and furthermore, the pressure in the chamber is released, the sheet B is melted in the closed space and intrudes into the gap between the package substrate and the electronic parts, whereby underfilling of the electronic parts is effected, Also, the covering sheet A plays the part of a jig for preventing leakage of the melt of the sheet B and also fulfills a role as an overmold. In this way, it has been found that overmolding and underfilling can be easily achieved without requiring a jig for preventing leakage of the resin composition. The present invention has been accomplished based on this finding.

As described above, in the method for manufacturing an electronic parts device of the present invention, in accordance with the electronic parts-mounting area on a package substrate, a sheet B being slightly smaller or larger than the area and having a viscosity of 20 to 250 Pa·s at the molding temperature (a temperature selected from the range of 70 to 150° C.) is stacked, a sheet A being larger than the area and having a viscosity of 2,000 to 50,000 Pa·s at the molding temperature is stacked thereon, the thus-obtained stack is heated at the molding temperature in a chamber under reduced pressure, thereby causing the sheet A to sag until producing a state of the sheet A covering the sheet B and the electronic parts, and then, the pressure in the chamber is released to effect underfilling of the electronic parts by the melt of the sheet B in the closed space formed between the package substrate and the electronic parts due to covering with the sheet A. Accordingly, even when a jig for preventing leakage of the resin composition is not used, overmolding and underfilling can be easily achieved. In turn, contamination of the package substrate, the press or the like due to leakage of the melted resin composition, or a filling failure of an underfill can be eliminated, Also, in view of handleability or the like, a resin composition sheet for electronic parts encapsulation, which is a sheet obtained by stacking and integrating the above-described sheets A and B, can be more preferably used in the manufacturing method above.

BRIEF DESCRIPTION OF THE DRAWINGS

FIG. 1A is a perspective view of the sheet A, FIG. 1B is a perspective view of the sheet B, FIG. 1C is a side view of an electronic part, and FIG. 1I) is a plan view of the package substrate on which n electronic parts are disposed in an array.

FIG. 2A is a view showing a state of electronic parts being mounted on a package substrate, FIG. 2B is a view showing a state of sheets A and B being stacked on the electronic parts, and FIG. 2C is a view showing a state of heating at the molding temperature being performed in a chamber under reduced pressure.

FIG. 3A is a view showing a state of the end part of the sheet A sagging into contact with the package substrate due to decompression and heating in FIG. 2C, FIG. 3B is a view showing a state of a press plate being pressed against the sheet A, FIG. 3C is a view showing a state where the pressure in the chamber is released and underfilling of the electronic parts and furthermore, thermal curing are effected, and FIG. 3D is a view showing a state where the press plate is removed and an electronic parts device assembly is produced.

DETAILED DESCRIPTION OF THE INVENTION

Figure 1A:
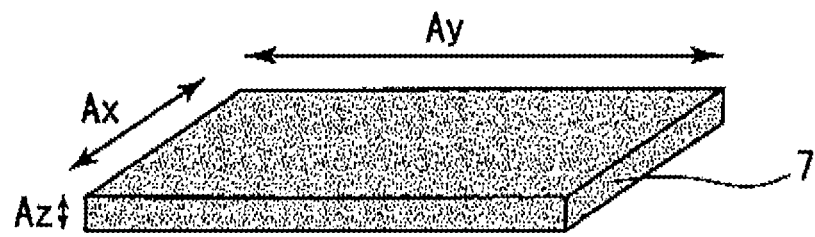
FIGS. 1A to 1D are explanatory views for specifically illustrating the portions where the length and the like are specified in the present invention, that is.

The mode for carrying out the present invention is described in detail below.

As described above, the method for manufacturing an electronic parts device of the present invention includes: a step of disposing a plurality of electronic parts in an array on a package substrate and then stacking, in order, a sheet B and a sheet A on an electronic parts-mounting area of the package substrate while arranging the center and XY-plane direction of the electronic parts-mounting area to substantially agree with the centers and XY-plane directions of both the sheets A and B; a step of heating the package substrate which holds this arrangement state at a molding temperature selected from the range of 70 to 150° C. in a chamber under reduced pressure, thereby causing the end part of the entire circumference of the sheet A to be softened and sag into contact with the package substrate and tightly closing the space surrounded by the entire circumference of the sheet A; a step of, in the sagged state, pressing the sheet A covering the sheet B and the electronic parts; a step of releasing the pressure in the chamber to perform underfilling of the electronic parts by the melt of the sheet B in the closed space formed between the sheet A and the package substrate; a step of, after the underfilling, thermally curing the resin compositions of both the sheets A and B to obtain an electronic parts device assembly where the plurality of electronic parts on the package substrate are resin-encapsulated; and a step of dicing the electronic parts device assembly to obtain each discrete electronic parts device. Incidentally, the XY-plane direction of the electronic parts-mounting area indicates the X direction arbitrarily determined on the electronic parts-mounting area plane and the Y direction orthogonal thereto on the same plane. The same applies to the XY-plane directions of both the sheets A and B. Also, the present invention specifies that "while arranging the center and XY-plane direction of the electronic parts-mounting area to substantially agree with the centers and XY-plane directions of both the sheets A and B", and this is intended, with respect to the arrangement above, to allow for slight misalignment of the center or XY-plane direction.

As the sheet A, a thermosetting resin composition sheet having a viscosity at the molding temperature (from 70 to 150° C.) selected as above of from 2,000 to 50,000 Pa·s and having a dimension satisfying the following condition (1) is used. The dimension condition above is preferably the following condition (1'), because the encapsulation can be achieved with good productivity. That is, when a sheet A having such specific viscosity and size is used for the method for manufacturing an electronic parts device of the present invention, as described above, the sheet A sags to fulfill the function of preventing leakage of the melt of the sheet B and the electronic parts can be thereby encapsulated without requiring a jig for preventing the leakage. Incidentally, if the viscosity of the sheet A at the molding temperature is less than 2,000 Pa·s, the sheet A itself may be melted to cause resin leakage, whereas if it exceeds 50,000 Pa·s, the sheet cannot fulfill the function as a jig for preventing leakage of the melt of the sheet B and a failure in underfill filling tends to be caused. For this reason, the viscosity is specified as above. The viscosity under the above-described temperature condition may be determined by the measurement using a general rheometer but can be derived, for example, by performing the measurement using a rotational viscometer (Rheostress RS1, manufactured by HAKKE) under the conditions of a gap of 100 μm, a rotary cone diameter of 20 mm and a rotation speed of $10\ s^{-1}$.

$$Ax > P+8$$

$$Ay > Q+8 \qquad \text{<Condition (1)>}$$

in which $Ax$ is a length (mm) in an X-axis direction of the sheet A, $Ay$ is an length (mm) in a Y-axis direction of the sheet A, $P$ is a length (mm) in an X direction of the electronic parts-mounting area, and $Q$ is a length (mm) in a Y direction of the electronic parts-mounting area.

$$t1+t2+40+P > Ax > t1+t2+8+P$$

$$t1+t2+40+Q > Ay > t1+t2+8+Q$$

$$(t1+0.5)-[(n \times Vc)/(P \times Q)] > Az > t1-[(n \times Vc)/(P \times Q)] \qquad \text{<Condition (1')>}$$

in which $Ax$ is the length (mm) in the X-axis direction of the sheet A, $Ay$ is the length (mm) in the Y-axis direction of the sheet A, $Az$ is a thickness (mm) of the sheet A, $t1$ is a thickness (mm) of electronic parts, $t2$ is a height (mm) of the electrode part for connection of the electronic part, $P$ is the length (mm) in the X direction of the electronic parts-mounting area, $Q$ is the length (mm) in the Y direction of the electronic parts-mounting area, $Vc$ is a volume ($mm^3$) per one electronic part, and $n$ is the number of electronic parts encapsulated.

As the sheet B, a thermosetting resin composition sheet having a viscosity at the molding temperature (from 70 to 150° C.) selected as above of from 20 to 250 Pa·s and having a dimension satisfying the following condition (2) is used. The dimension condition above is preferably the following condition (2'), because the encapsulation can be achieved with good productivity. That is, when a sheet B having such specific viscosity and size is used for the method for manufacturing an electronic parts device of the present invention, the melt of the sheet B intruded also into a narrow gap between the package substrate and electronic parts and the underfilling is thereby facilitated. Incidentally, if the viscosity of the sheet B at the molding temperature is less than 20 Pa·s, the sheet B tends to have tackiness and become difficult to handle, whereas if it exceeds 250 Pa·s, underfill filling is liable to become difficult. For this reason, the viscosity is specified as above. The viscosity under the above-described temperature condition can be derived by performing the measurement in the same manner as done for the sheet A.

$$Ax \geq Bx > P \times 0.8$$

$$Ay \geq By > Q \times 0.8 \qquad \text{<Condition (2)>}$$

in which $Bx$ is a length (mm) in an X-axis direction of the sheet B, $By$ is a length (mm) in a Y-axis direction of the sheet B, $P$ is the length (nm) in the X direction of the electronic parts-mounting area, $Q$ is the length (mm) in the Y direction of the electronic parts-mounting area, $Ax$ is the length (mm) in the X-axis direction of the sheet A, and $Ay$ is the length (mm) in the Y-axis direction of the sheet A.

$$Ax \geq Bx > P \times 0.8$$

$$Ay \geq By > Q \times 0.8$$

$$\{[P \times Q \times (t1+t2) - n(Vc+Vb)]/(P \times Q)\} + 0.1 > Bz > (t2 \times P \times Q - Vb \times n)/(P \times Q) \qquad \text{<Condition (2')>}$$

in which Bx is the length (mm) in the X-axis direction of the sheet B, By is the length (mm) in the Y-axis direction of the sheet B, Bz is a thickness (mm) of the sheet B, t1 is the thickness (mm) of the electronic parts, t2 is the height (mm) of the electrode part for connection of the electronic part, P is the length (mm) in the X direction of the electronic parts-mounting area, Q is the length (mm) in the Y direction of the electronic parts-mounting area, Vb is a total volume (mm$^3$) of bumps (electrode parts for connection) mounted on one electronic part, Vc is the volume (mm$^3$) per one electronic part, n is the number of electronic parts encapsulated, Ax is the length (mm) in the X-axis direction of the sheet A, and Ay is the length (mm) in the Y-axis direction of the sheet A.

Figure 1B:
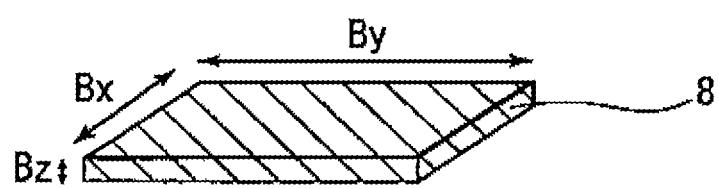
Figure 1C:
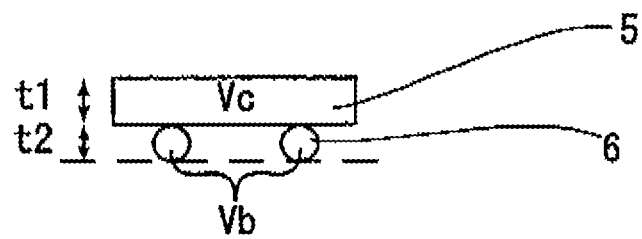
Figure 1D:
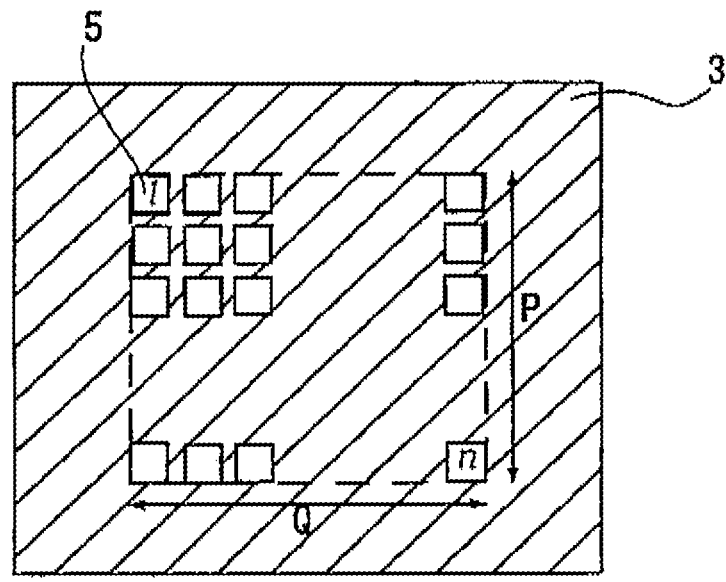

Here, FIGS. 1A to 1D are explanatory views for specifically illustrating the portions where the length and the like are specified in the conditions (1) to (2'), that is, FIG. 1A is a perspective view of the sheet A, FIG. 1B is a perspective view of the sheet B, FIG. 1C is a side view of an electronic part, and FIG. 1D is a plan view of the package substrate on which n electronic parts are disposed in an array. In the Figures, the symbols are corresponding to those in the conditions (1) to (2'). Also, in the Figures, 3 indicates the package substrate, 5 indicates an electronic part, 6 indicates an electrode part (bump) for connection of the electronic part, 7 indicates a sheet A, and 8 indicates a sheet B.

The material of the sheet A is not particularly limited as long as it is a thermosetting resin composition sheet where, as described above, the viscosity at the molding temperature selected from the range of 70 to 150° C. is in the specific range and the size satisfies the specific conditions, but an epoxy resin composition containing the following components (a) to (d) is preferably used:

(a) an epoxy resin having a viscosity at 25° C. of 1.0 to 10.0 Pa·s, (b) a curing agent, (c) an inorganic filler including the following components (c1) to (c3), the total content of the components (c2) and (c3) being from 2 to 60 parts by weight per 100 parts by weight of the component (c1), (c1) an inorganic filler having an average particle diameter of 5 to 20 μm, (c2) an inorganic filler having an average particle diameter of 1 to 3 μm, and (c3) an inorganic filler having an average particle diameter of 0.3 to 0.8 μm, and (d) a flexibility-imparting agent.

Examples of the epoxy resin as the component (a) include a bisphenol A-type epoxy resin, a bisphenol F-type epoxy resin, a glycidyl amine-type epoxy resin and a glycidyl ester-type epoxy resin each having a viscosity at 25° C. of 1.0 to 10.0 Pa·s. Among these, in view of curability of the resin composition, bisphenol A-type epoxy resin and bisphenol F-type epoxy reach each having the above-described viscosity are preferred. Incidentally, commercial product such as EXA-850CRP (produced by DIC), EPON-827 and YL-983U (both produced by Mitsubishi Chemical Corporation) are available as the epoxy resin of the component (a). The viscosity of the epoxy resin as the component (a) may be determined by the measurement using a general rheometer but can be derived, for example, by performing the measurement using a rotational viscometer (Rheostress RS1, manufactured by HAKKE) under the conditions of a gap of 100 μm, a rotary cone diameter of 20 mm and a rotation speed of 10 s$^{-1}$.

In view of viscosity adjustment of the sheet A and reliability of the cured product of the resin composition, the content of the component (a) in the epoxy resin composition constituting the sheet A is preferably from 8 to 17 wt %, more preferably from 9 to 12 wt %, based on the resin composition.

In the case of using an epoxy resin other than the component (a) in combination, the component (a) preferably accounts for 80 wt % or more of all epoxy resins.

A component causing a curing reaction with the epoxy resin of component (a) is used for the curing agent of the component (b). Examples of the curing agent include a phenolic resin, an acid anhydride, and an amine compound. Among these, in view of reactivity with the component (a), a phenolic resin is preferred; in view of viscosity adjustment of the sheet A, a phenolic resin having a softening point of 60 to 130° C. is more preferred; and in view of reliability of the cured product of the resin composition, a phenol novolak resin and a triphenylmethane-type phenolic resin are still more preferred.

In the case where the component (b) is a phenolic resin, in view of reliability of the cured product of the resin composition, the phenolic resin is preferably blended such that the total of hydroxyl groups in the component (b) becomes from 0.8 to 1.2 equivalents, more preferably from 0.9 to 1.1 equivalents, per one equivalent of the epoxy group in the component (a).

As the inorganic filler of the component (c) used together with the components (a) and (b), as described above, an inorganic filler including inorganic fillers differing in the average particle diameter [(c1) an inorganic filler having an average particle diameter of 5 to 20 μm, (c2) an inorganic filler having an average particle diameter of 1 to 3 μm, and (c3) an inorganic filler having an average particle diameter of 0.3 to 0.8 μm], the total content of the components (c2) and (c3) being from 2 to 60 parts by weight per 100 parts by weight of the component (c1), is preferably used. Incidentally, the average particle diameter of the inorganic filler can be derived, for example, by using a sample arbitrarily extracted from the parent population and performing the measurement using a laser diffraction/scattering particle size distribution analyzer.

For the inorganic filler of the component (c), an inorganic filler where the material thereof includes, for example, a powder material such as quartz glass, talc, silica (e.g., molten silica, crystalline silica), alumina, aluminum nitride and silicon nitride is used. Above all, in view of dispersibility of the inorganic filler and moldability of the sheet A, silica is preferred; and in view of melt flowability of the resin composition, spherical molten silica is more preferred.

From the standpoint of moisture resistance of the cured product of the resin composition, the content of the component (c) in the epoxy resin composition constituting the sheet A is preferably from 70 to 85 wt %, more preferably from 78 to 83 wt %, based on the resin composition.

A material capable of imparting plasticity and flexibility to the sheet A is used as the flexibility-imparting agent of the compound (d) used together with the components (a) to (c). Examples of the material which can be used to provide such an action include various acrylic copolymers such as polyacrylic acid ester, and a rubbery polymer such as styrene acrylate-based copolymer, butadiene rubber, styrene-butadiene rubber (SBR), ethylene-vinyl acetate copolymer (EVA), isoprene rubber and acrylonitrile rubber. Among these, in view of easy dispersibility in the component (a) and high reactivity with the component (a), an acrylic copolymer is preferably used. One of these flexibility-imparting agents is used alone, or two or more thereof are used in combination.

The acrylic copolymer can be synthesized, for example, by performing radical polymerization of an acrylic monomer mixture in a predetermined mixing ratio according to a conventional method. As the method for radical polymerization, a solution polymerization method performed using an organic solvent as the solvent, or a suspension polymerization method of performing the polymerization while dispersing the raw material monomers in water. Examples of the polymerization initiator used at the polymerization include 2,2'-azobisisobutyronitrile, 2,2'-azobis-(2,4-dimethylvaleronitrile), 2,2'-azobis-4-methoxy-2,4-dimethylvaleronitrile, other azo-based or diazo-based polymerization initiators, and a peroxide-based polymerization initiator such as benzoyl peroxide and methyl ethyl ketone peroxide. Incidentally, in the case of suspension polymerization, it is preferred to add a dispersant such as polyacrylamide and polyvinyl alcohol.

From the standpoint of plasticity, flexibility and melt viscosity of the sheet A, the content of the component (d) in the epoxy resin composition constituting the sheet A is preferably from 1 to 10 wt % based on the resin composition. In the resin composition, in addition to the components (a) to (d), other additives such as curing accelerator, flame retardant and pigment including carbon black may be appropriately blended, if desired.

The material of the sheet B used together with the sheet A is not particularly limited as long as it is a thermosetting resin composition sheet where, as described above, the viscosity at the molding temperature selected from the range of 70 to 150° C. is in the specific range and the size satisfies the specific conditions, but an epoxy resin composition containing the following components (e) to (h) is preferably used (e) a mixture of an epoxy resin having a softening point of 60 to 130° C. and a liquid epoxy resin, (f) a curing agent, (g) an inorganic filler having an average particle diameter of 0.3 to 3 μm, and (h) a flexibility-imparting agent.

Examples of the epoxy resin having a softening point of 60 to 130° C. in the component (e) include a triphenylmethane-type epoxy resin, an orthocresol novolak-type epoxy resin, a brominated epoxy resin, a naphthol aralkyl-type epoxy resin, dicyclopentadiene-type epoxy resin, biphenol-type epoxy resin and naphthalene-type epoxy resin each having the above-described softening point. Incidentally, commercial products such as EPPN-501HY, EOCN-1020, BREN-105 (all produced by Nippon Kayaku Co., Ltd.), KI-3000, KI-5000, ESN-175S (all produced by Nippon Steel Chemical Co., Ltd.), HP-7200, EXA-4700 (both produced by DIC), YX-4000H and YX-4000K (both produced by Mitsubishi Chemical Corporation) are available as the epoxy resin having a softening point of 60 to 130° C.

Examples of the liquid epoxy resin in the component (e) include a bisphenol A-type epoxy resin, a bisphenol F-type epoxy resin, a glycidyl amine-type epoxy resin and a glycidyl ester-type epoxy resin each being liquid at 25° C. Incidentally, commercial products such as YL-980, JER-827, JER-828, YX-8000 (all produced by Mitsubishi Chemical Corporation), YD-8125, ZX-1059 (both produced by Nippon Steel Chemical Co., Ltd.), EPICLON (registered trademark)-830 and EPICLON (registered trademark)-850 (both produced by DIC) are available as the above-described liquid epoxy resin.

In view of tackiness of the sheet B, the content of the epoxy resin having a softening point of 60 to 130° C. in the component (e) is preferably from 20 to 100 parts by weight, more preferably from 30 to 60 parts by weight, per 100 parts by weight of the liquid epoxy resin.

In view of moldability of the sheet B, the content of the component (e) in the epoxy resin composition constituting the sheet B is preferably from 20 to 35 wt %, more preferably from 25 to 30 wt %, based on the resin composition.

A component causing a curing reaction with the epoxy resin of the component (e) is used for the curing agent of the component (f). Examples of the curing agent include a phenolic resin, an acid anhydride, and an amine compound. Among these, in view of reactivity with the component (e), a phenolic resin is preferred; in view of moldability of the sheet B, a phenolic resin such as phenol novolak resin, phenol biphenylene resin, phenol aralkyl resin and phenol naphthol resin is more preferred; and in view of reliability of the cured product of the resin composition, a phenol novolak resin and a phenol aralkyl resin are still more preferred.

In the case where the component (f) is a phenolic resin, in view of reliability of the cured product of the resin composition, the phenolic resin is preferably blended such that the total of hydroxyl groups in the component (f) becomes from 0.8 to 1.2 equivalents, more preferably from 0.9 to 1.1 equivalents, per equivalent of the epoxy group in the component (e).

As the inorganic filler of the component (g) used together with the components (e) and (f), an inorganic filler having an average particle diameter of 0.3 to 3 μm is used. The average particle diameter of the component (g) can be derived in the same manner as that of the inorganic filler of the component (c). For the inorganic filler above, an inorganic filler where the material thereof includes, for example, a powder material such as quartz glass, talc, silica (e.g., molten silica, crystalline silica), alumina, aluminum nitride and silicon nitride is used. Above all, in view of dispersibility of the inorganic filler and moldability of the sheet B, silica is preferred; and in view of melt flowability of the resin composition, spherical molten silica is more preferred. Also, from the standpoint of dispersibility of the inorganic filler, it is still more preferred to use silica previously surface-treated with a silane coupling agent. The coupling agent for silica is not particularly limited as long as it is a coupling agent usually used.

In view of reliability of the cured product of the resin composition, the content of the component (g) in the epoxy resin composition constituting the sheet B is preferably from 30 to 80 wt % based on the resin composition, and in view of tackiness of the sheet B and flowability of the resin composition, more preferably from 50 to 65 wt % based on the resin composition.

A material capable of imparting plasticity and flexibility to the sheet B is used as the flexibility-imparting agent of the compound (h) used together with the components (e) to (g). As the material providing such an action, the same materials as those for the flexibility-imparting agent of the component (d) are used. That is various acrylic copolymers such as polyacrylic acid ester, and a rubbery polymer such as styrene acrylate-based copolymer, butadiene rubber, styrene-butadiene rubber (SER), ethylene-vinyl acetate copolymer (EVA), isoprene rubber and acrylonitrile rubber can be used. Among these, from the standpoint of easy dispersibility in the component (e) and high reactivity with the component (e), an acrylic copolymer is preferably used. One of these flexibility-imparting agents is used alone, or two or more thereof are used in combination.

In view of plasticity, flexibility and melt viscosity of the sheet B, the content of the component (h) in the epoxy resin composition constituting the sheet B is preferably from 4 to 9 wt % based on the resin composition. In the resin composition, in addition to the components (e) to (h), other additives such as curing accelerator, flame retardant and pigment including carbon black may be appropriately blended, if desired.

The sheet A and the sheet B can be produced, for example, as follows.

The resin composition as the material of each of the sheet A and the sheet B is prepared by mixing respective components until they are uniformly dispersed and mixed, and the prepared resin composition is formed into a sheet. Examples of the forming method therefor include a method of forming the prepared resin composition into a sheet by extrusion molding, and a method of dissolving or dispersing the prepared resin composition in an organic solvent or the like to prepare a varnish and then coating and drying the varnish on a base material such as polyester, thereby obtaining a resin composition sheet. Among these, from the standpoint that a sheet with a uniform thickness can be simply and easily obtained, the forming method by coating of a varnish is preferred. Incidentally, if desired, a release sheet such as polyester film for protecting the surface of the resin composition sheet may be laminated to the surface of the resin composition sheet formed as above and may be separated at the encapsulation.

Examples of the organic solvent which can be used at the production of the varnish include methyl ethyl ketone, acetone, cyclohexanone, dioxane, diethyl ketone, toluene and ethyl acetate. One of these organic solvents is used alone, or two or more thereof are used in combination. Usually, the organic solvent is preferably used to give a varnish having a solid content concentration of 30 to 60 wt %.

In view of the thickness uniformity and the residual solvent amount, the thickness of the sheet after drying the organic solvent is preferably set to be from 5 to 100 μm, more preferably from 20 to 70 μm. If desired, the thus-obtained resin composition sheet may be used by stacking the sheets to achieve a desired thickness. That is, for the sheet A and the sheet B, the resin composition sheet above having a single-layer structure may be used, or a laminate obtained by stacking the resin composition sheets to form a multilayer structure of two or more layers may be used. However, since the size of the sheet A must satisfy the condition (1) (preferably the condition (1')) and the size of the sheet B must satisfy the condition (2) (preferably the condition (2')), the sheet or laminate is adjusted to the size specified (see, FIGS. 1A and 1B).

The resin encapsulating process in the method for manufacturing an electronic parts device of the present invention using the sheets A and B obtained as above is performed, for example, as shown in FIGS. 2A to 2C and 3A to 3D.

Figure 2A:
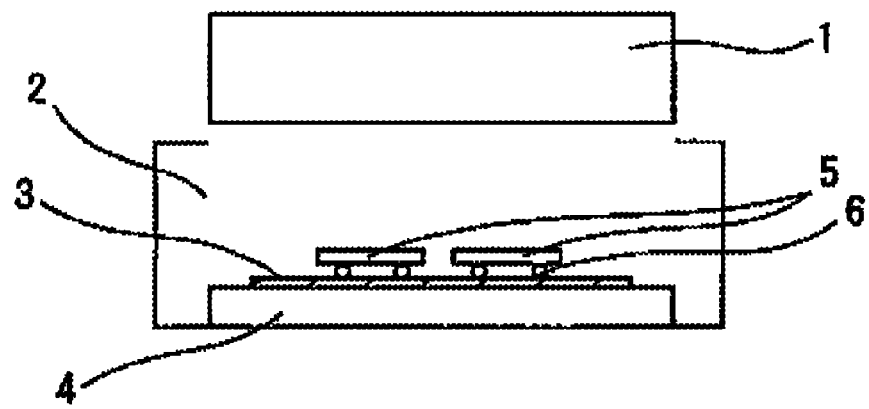
FIGS. 2A to 2C are explanatory views illustrating the resin encapsulating step in the method for manufacturing an electronic parts device of the present invention, that is.

That is, first, as shown in FIG. 2A, electronic parts 5 are disposed on a package substrate 3 such that the electrode part for connection (not shown) of the package substrate is connected to the electrode part 6 for connection of the electronic part. In the Figure, 1 indicates an upper press plate, 2 indicates a chamber, and 4 indicates a lower press plate.

Figure 2B:
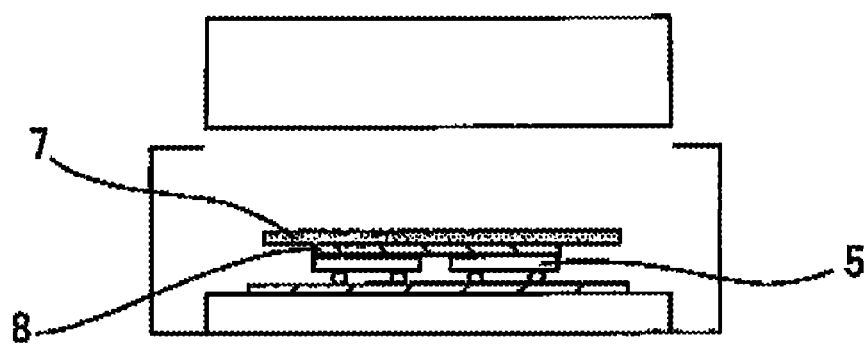

Next, as shown in FIG. 2B, the resin composition sheet for electronic parts encapsulation, including a sheet A (7) and a sheet B (8) is stacked on the electronic parts 5. Here, the sheets A and B must be disposed, as shown in the Figure, to cover the electronic parts according to the above-described conditions specified in the method for manufacturing an electronic parts device of the present invention. At this time, the sheet A may be disposed to cover the sheet B after disposing the sheet B to cover the electronic parts, or the sheet A and the sheet B may be disposed in a state of being previously laminated together. Particularly, in view of handling and the like, when the resin composition sheet for electronic parts encapsulation used in the method for manufacturing the present invention is a sheet obtained by previously stacking and integrating the sheet A and the sheet B in a state of being laminated together, the sheet can be more preferably used in the manufacturing method.

Figure 2C:
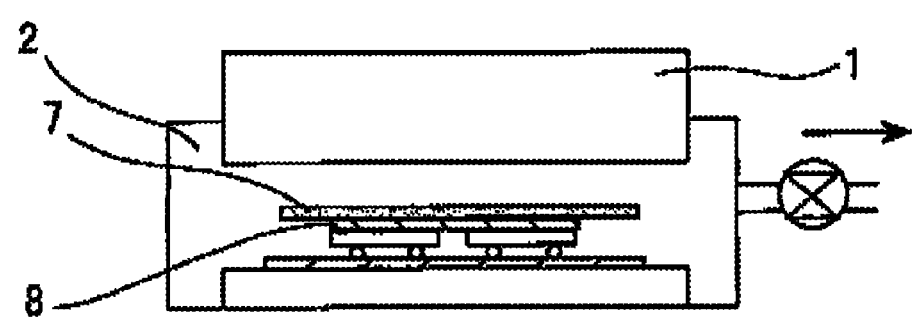
Figure 3A:
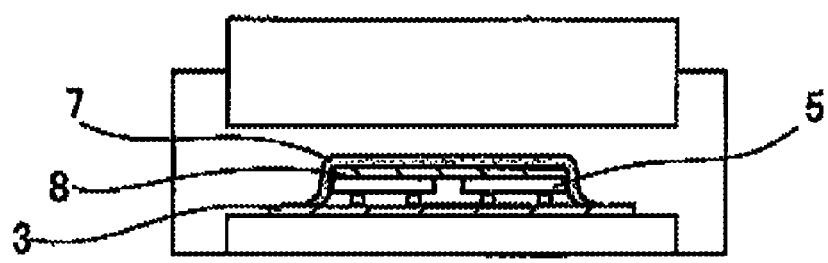
FIGS. 3A to 3D is explanatory views illustrating the resin encapsulating step in the method for manufacturing an electronic parts device of the present invention, that is.

Subsequently, as shown in FIG. 2C, after the chamber 2 of the molding apparatus is closed by moving the upper press plate 1, the inside of the chamber 2 is put into a pressure reduction state (air is expelled toward the arrow direction shown) and heated at a molding temperature selected from the range of 70 to 150° C. By this operation, the viscosity of the sheet A (7) is increased to 2,000 to 50,000 Pa·s and as shown in FIG. 3A, the end part of the sheet A (7) sags into contact with the package substrate 3. This sagging creates a state of the sheet A (7) covering the sheet B (8) and the electronic parts 5. At this time, as shown in the Figure, the sheet A (7) forms a closed space between the sheet and the package substrate 3 by its covering, and the sheet B (8) turns into a low-viscosity (20 to 250 Pa·s) gel in the closed space. Incidentally, from the standpoint of allowing this process to successfully proceed, the pressure reduction inside the chamber 2 is preferably performed in the range of 0.01 to 5 kPa.

Figure 3B:
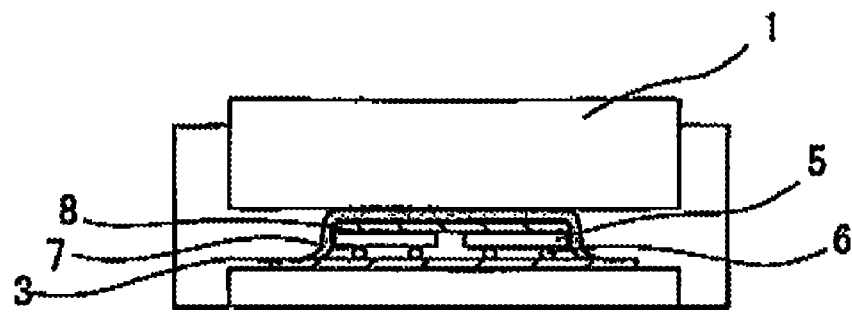

In this state, as shown in FIG. 3B, the upper press plate 1 is pressed against the sheet A. In view of adhering the sheet A (7) to the electronic parts 5, the pressing is preferably performed under a pressure of 50 to 1,000 kPa. At this time, it is preferred that the temperature is set still to the molding temperature selected from the range of 70 to 150° C. and the press time is from 1 to 5 minutes.

Figure 3C:
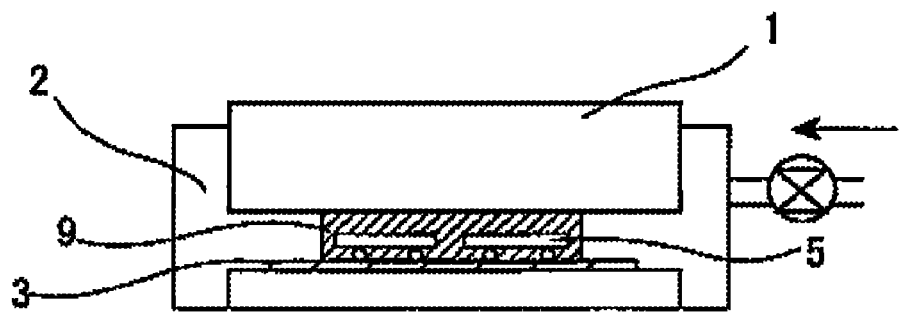

Thereafter, as shown in FIG. 3C, the pressure inside the chamber 2 is released (air is allowed to inflow toward the arrow direction shown by opening the valve), as a result, the sheet B (8) becomes a melt in the closed space between the sheet A (7) and the package substrate 3 and intrudes into the gap between the package substrate 3 and the electronic part 5, whereby underfilling of the electronic parts 5 is effected without forming a hollow between electrode parts (bumps) 6 for connection. At this time, the covering sheet A (7) plays the part of a jig for preventing leakage of the melt of the sheet B (8) and also fulfills a role as an overmold. In this way, overmolding and underfilling can be easily achieved without requiring a jig for preventing leakage of the resin composition. Incidentally, at the underfilling, as shown in FIG. 3C, the pressure inside the chamber 2 is preferably released while keeping the pressed state so as to suppress the warpage of the electronic part 5.

Figure 3D:
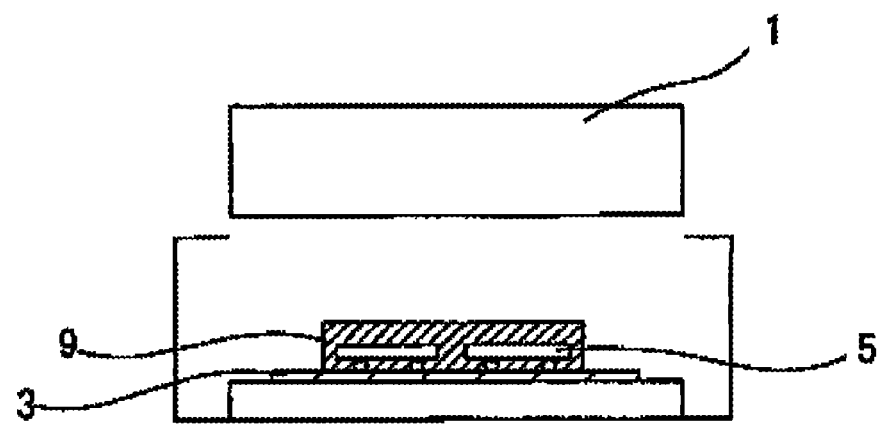

After the underfilling, the resin compositions (melts of both the sheets A and B) are thermally cured by heating to a temperature at which both the sheets A and B are thermally cured (a temperature exceeding 150° C., preferably a thermal curing temperature of 155 to 185° C.) to form an encapsulating resin layer 9 including the cured product of the resin composition. In this way, an electronic parts device assembly where a plurality of electronic parts 5 on the package substrate 3 are resin-encapsulated can be obtained. Incidentally, the thermal curing may be performed, as shown in FIG. 3D, in a state of being released from the pressure of the upper press plate 1, but, as shown in FIG. 3C, when the resin compositions are thermally cured while keeping the pressed state, warpage of the electronic parts device assembly is suppressed and this is preferred. Also, in order to allow the thermal curing to swiftly and completely proceed, the heating time is preferably from 1 to 3 hours.

The electronic parts device assembly obtained in this way through the resin encapsulating process is finally diced after appropriately attaching a dicing tape to the resin-encapsulated surface thereof, whereby each discrete electronic parts device can be obtained (not shown).

EXAMPLES

Examples and Comparative Examples are described together below. However, the present invention is not limited to these Examples.

Each of the following component materials was prepared.

[Epoxy Resin I]
Bisphenol A-type epoxy resin (EXA-850CRP, produced by DIC, viscosity at 25° C.: 4.4 Pa·s, epoxy equivalent: 171).

[Epoxy Resin II]
Bisphenol A-type epoxy resin (YL-980, produced by Mitsubishi Chemical Corporation, liquid, epoxy equivalent: 186).

[Epoxy Resin III]
Triphenylmethane-type epoxy resin (EPPN-501HY, produced by Nippon Kayaku Co., Ltd., softening point: 60° C., epoxy equivalent: 169).

[Curing Agent I]
Phenol novolak resin (ND-564, produced by Meiwa Plastic Industries, Ltd., hydroxyl group equivalent: 107, softening point: 65° C.).

[Curing Agent II]
Phenol novolak resin (GS-180, produced by Gun Ei Chemical Industry Co., Ltd., hydroxyl group equivalent: 105, softening point: 83° C.).

[Curing Agent III]
Phenol aralkyl resin (MEHC-7800S, produced by Meiwa Plastic Industries, Ltd., hydroxyl group equivalent: 174, softening point: 76° C.).

[Inorganic Filler I]
Spherical molten silica having an average particle diameter of 5.8 μm and a maximum particle diameter of 24 μm (FB-7SDC, produced by Denki Kagaku Kogyo Kabushiki Kaisha).

[Inorganic Filler II]
Spherical molten silica having an average particle diameter of 1.5 μm and a maximum particle diameter of 5.1 μm (SO-32R, produced by Admatechs Company Limited).

[Inorganic Filler III]
Spherical molten silica having an average particle diameter of 0.5 μm and a maximum particle diameter of 1.5 μm (SO-25R, produced by Admatechs Company Limited).

[Inorganic Filler IV]
Inorganic filler III surface-treated with 3-glycidoxypropyltrimethoxysilane.

[Curing Accelerator I]
Tetraphenylphosphonium·tetraphenylborate

[Curing Accelerator II]
2-Phenyl-4-methyl-5-hydroxymethylimidazole (2PHZ-PW, produced by Shikoku Corp.).

[Flexibility-Imparting Agent]
Acrylic copolymer (a copolymer composed of butyl acrylate:acrylonitrile:glycidyl methacrylate=85:8:7 wt %, weight average molecular weight: 800,000).

The acrylic copolymer above was synthesized as follows. That is, butyl acrylate, acrylonitrile and glycidyl methacrylate were blended in a charge weight ratio (wt %) of 85:8:7, 2,2'-azobisisobutyronitrile as a polymerization initiator was blended thereto, and radical polymerization was performed in methyl ethyl ketone at 70° C. for 5 hours and at 80° C. for 1 hour under nitrogen flow, whereby the acrylic copolymer above was obtained.

[Production of Resins Sheets 1 to 15]
Respective component materials above were dispersed or mixed in a ratio shown in Tables 1 and 2 below, and methyl ethyl ketone in the same amount as the total amount of respective component materials was added to prepare a varnish for coating. The varnish was coated by a comma coater on a release-treated surface of a 38 μm-thick polyester film (MRF-38, produced by Mitsubishi Plastics Industries, Ltd.) and dried to obtain a resin composition sheet having a thickness of 50 μm. Subsequently, the release-treated surface of a separately prepared polyester film was affixed to the resin composition sheet above, and the affixed sheets were rolled up. Thereafter, the resin composition sheet above was stacked by a roller laminator while appropriately separating the polyester film, whereby a resin composition sheet having a desired thickness (Resin Sheets 1 to 15) was obtained. The viscosity of the thus-obtained resin composition sheet was measured using a rotational viscometer (Rheostress RS1, manufactured by HAKKE) under the conditions of a measurement temperature of 130° C., a gap of 100 μm, a rotary cone diameter of 20 mm and a rotation speed of 10 s$^{-1}$. The measurement results are also shown together in Tables 1 and 2 below.

TABLE 1

| Composition (wt %) | | | Resin Sheet | | | | | | |
|---|---|---|---|---|---|---|---|---|---|
| | | | 1 | 2 | 3 | 4 | 5 | 6 | 7 |
| Epoxy resin | | I | 12.1 | 10.5 | 9.4 | 8.8 | 8.3 | 7.2 | 6.1 |
| | | II | — | — | — | — | — | — | — |
| | | III | — | — | — | — | — | — | — |
| Curing agent | | I | 7.5 | 6.5 | 5.8 | 5.4 | 5.1 | 4.4 | 3.7 |
| | | II | — | — | — | — | — | — | — |
| | | III | — | — | — | — | — | — | — |
| Inorganic filler | | I | 50.7 | 52.7 | 53.9 | 54.6 | 55.3 | 56.6 | 57.9 |
| | | II | 15.6 | 16.2 | 16.7 | 16.8 | 17.0 | 17.4 | 17.8 |
| | | III | 11.7 | 12.2 | 12.4 | 12.6 | 12.8 | 13.0 | 13.3 |
| | | IV | — | — | — | — | — | — | — |
| Curing accelerator | | I | — | — | — | — | — | — | — |
| | | II | 0.2 | 0.2 | 0.2 | 0.2 | 0.2 | 0.1 | 0.1 |
| Flexibility-imparting agent | | | 2.2 | 1.9 | 1.7 | 1.6 | 1.5 | 1.3 | 1.1 |
| Viscosity at 130° C. (Pa · s) | | | 1100 | 2540 | 5220 | 12900 | 13900 | 467000 | 628000 |

TABLE 2

| Composition (wt %) | | | Resin Sheet | | | | | | | |
|---|---|---|---|---|---|---|---|---|---|---|
| | | | 8 | 9 | 10 | 11 | 12 | 13 | 14 | 15 |
| Epoxy resin | | I | — | — | — | — | — | — | — | — |
| | | II | 20.0 | 16.2 | 13.1 | 11.9 | 9.1 | 7.4 | 4.8 | 1.9 |
| | | III | 8.5 | 6.8 | 5.4 | 4.9 | 3.8 | 3.1 | 2.0 | 0.8 |

TABLE 2-continued

| | | \multicolumn{8}{c}{Resin Sheet} |
| --- | --- | --- | --- | --- | --- | --- | --- | --- | --- |
| | | 8 | 9 | 10 | 11 | 12 | 13 | 14 | 15 |
| Curing agent | I | — | — | — | — | — | — | — | — |
| | II | 8.5 | 6.8 | 5.9 | 5.3 | 4.1 | 3.3 | 2.1 | 0.9 |
| | III | 12.7 | 10.5 | 8.6 | 7.8 | 6.0 | 4.8 | 3.1 | 1.3 |
| Inorganic filler | I | — | — | — | — | — | — | — | — |
| | II | — | — | — | — | — | — | — | — |
| | III | — | — | — | — | — | — | — | — |
| | IV | 49.7 | 42.9 | 37.4 | 41.4 | 38.9 | 38.9 | 31.5 | 16.3 |
| Curing accelerator | I | 0.6 | 0.5 | 0.5 | 0.4 | 0.3 | 0.3 | 0.2 | 0.1 |
| | II | — | — | — | — | — | — | — | — |
| Flexibility-imparting agent | | — | 2.6 | 4.5 | 4.1 | 3.1 | 2.5 | 1.6 | 0.7 |
| Viscosity at 130° C. (Pa·s) | | 16 | 26 | 55 | 59 | 111 | 156 | 333 | 1186 |

Examples 1 to 14 and Comparative Examples 1 to 9

52 Bumps (diameter: 0.5 mm, height (t2): 0.1 mm) as the electrode part for connection were provided on an Si chip (10 mm (length)×10 mm (width)×0.2 mm (thickness (t1)), volume (Vc) per one electronic part was 20 mm$^3$) (total volume (Vb) of bumps mounted on one electronic part was 1.0205 mm$^3$), and four Si chips with bumps were arranged and disposed in a checkerboard pattern at intervals of 1 mm on an epoxy substrate (70 mm (length)×70 mm (width)) as a package substrate (the number (n) of electronic parts encapsulated was 4, the length (P) in the X direction of the electronic parts-mounting area was 21 mm, and the length (Q) in the Y direction of the electronic parts-mounting area was 21 mm) (see, FIGS. 1C and 1D).

Subsequently, resin sheets corresponding to the sheet A and the sheet B were prepared. Incidentally, the resin sheet is a sheet having the size and composition shown in Tables 3 to 5 later, and the sheet No. in the column, of "Composition" of Tables 3 to 5 indicates the sheet No. in Tables 1 and 2. The dimension of the resin sheet corresponding to the sheet A is denoted by "A" in the column of "Condition (1)" of Tables 3 to 5 when satisfying <Condition (1)> specified in the present invention and denoted by "B" when not satisfying <Condition (1)>. Also, the dimension of the resin sheet corresponding to the sheet B is denoted by "A" in the column of "Condition (2)" of Tables 3 to 5 when satisfying <Condition (2)> specified in the present invention and denoted by "B" when not satisfying <Condition (2)>.

The resin sheets corresponding to the sheet A and the sheet B were disposed on electronic parts to cover the electronic parts-mounting area by arranging the centers and XY-plane directions of the sheets to agree with the center and XY-plane direction of the electronic parts-mounting area. When disposing the resin sheets, a laminate where the sheet A and the sheet B are integrally stacked was disposed, and the sheet B side was arranged to come into contact with the electronic parts.

Thereafter, the pressure in the chamber in the molding apparatus was reduced to 2 kPa and further heated to 130° C. by heaters placed on the lower press plate and the upper press plate. While keeping the chamber in a pressure reduction state, the upper press plate was pressed against the sheet at a temperature of 130° C. under a pressure of 98 kPa for 3 minutes, and then, the pressure in the chamber was released, whereby the melted resin was filled in the gap between the package substrate and the electronic part (see, FIGS. 2A to C and FIGS. 3A to 3C).

Furthermore, the pressure of the press was released, and the electronic parts were encapsulated (overmolded and underfilled) by thermally curing the resin composition (175° C., 1 hour) and then naturally cooled to ordinary temperature to obtain an electronic parts device assembly (see, FIG. 3D).

Finally, a dicing tape was adhered to the resin-encapsulated surface of the electronic parts device assembly, and the electronic parts device assembly was diced to obtain an electronic parts device.

In the thus-performed manufacturing process of an electronic parts device, whether or not the resin leakage and underfilling property could fully satisfy the criteria of the present invention was evaluated as follows. The results obtained are shown together in Tables 3 to 5 later.

[Resin Leakage]

The obtained electronic parts device assembly was rated "B" when the encapsulating resin flowed to the end of the epoxy substrate, and rated "A" when the encapsulating resin did not flow to the end of the epoxy substrate. In the case where the encapsulating resin flowed to the end of the epoxy substrate, this has a possibility of contaminating the molding apparatus.

[Underfilling Property]

With respect to the obtained electronic parts device, the underfill portion was observed using a microscope in the state of transmitting light through the package substrate side, and the device was rated "B" when a void was confirmed, and rated "A" when a void was not confirmed.

TABLE 3

| | | \multicolumn{8}{c}{Example} |
| --- | --- | --- | --- | --- | --- | --- | --- | --- | --- |
| | | 1 | 2 | 3 | 4 | 5 | 6 | 7 | 8 |
| Resin Sheet A | Formulation | Sheet 2 | Sheet 3 | Sheet 4 | Sheet 3 | Sheet 3 | Sheet 3 | Sheet 3 | Sheet 3 |
| | Ax (mm) | 60 | 60 | 60 | 60 | 60 | 60 | 60 | 60 |
| | Ay (mm) | 60 | 60 | 60 | 60 | 60 | 60 | 60 | 60 |
| | Az (mm) | 0.4 | 0.4 | 0.4 | 0.4 | 0.4 | 0.4 | 0.4 | 0.4 |
| | Condition (1) | A | A | A | A | A | A | A | A |
| | 130° C. Viscosity (Pa·s) | 2540 | 5220 | 12900 | 5220 | 5220 | 5220 | 5220 | 5220 |

TABLE 3-continued

|  |  | Example |  |  |  |  |  |  |  |
|---|---|---|---|---|---|---|---|---|---|
|  |  | 1 | 2 | 3 | 4 | 5 | 6 | 7 | 8 |
| Resin Sheet B | Formulation | Sheet 10 | Sheet 10 | Sheet 10 | Sheet 9 | Sheet 10 | Sheet 11 | Sheet 12 | Sheet 13 |
|  | Bx (mm) | 20 | 20 | 20 | 20 | 20 | 20 | 20 | 20 |
|  | By (mm) | 20 | 20 | 20 | 20 | 20 | 20 | 20 | 20 |
|  | Bz (mm) | 0.12 | 0.12 | 0.12 | 0.12 | 0.12 | 0.12 | 0.12 | 0.12 |
|  | Condition (2) | A | A | A | A | A | A | A | A |
|  | 130° C. Viscosity (Pa·s) | 55 | 55 | 55 | 26 | 55 | 59 | 111 | 156 |
| Resin leakage |  | A | A | A | A | A | A | A | A |
| Undefilling property |  | A | A | A | A | A | A | A | A |

TABLE 4

|  |  | Comparative Example |  |  |  |  |  |  |
|---|---|---|---|---|---|---|---|---|
|  |  | 1 | 2 | 3 | 4 | 5 | 6 | 7 |
| Resin Sheet A | Formulation | Sheet 1 | Sheet 5 | Sheet 6 | Sheet 7 | Sheet 3 | Sheet 3 | Sheet 3 |
|  | Ax (mm) | 60 | 60 | 60 | 60 | 60 | 60 | 60 |
|  | Ay (mm) | 60 | 60 | 60 | 60 | 60 | 60 | 60 |
|  | Az (mm) | 0.4 | 0.4 | 0.4 | 0.4 | 0.4 | 0.4 | 0.4 |
|  | Condition (1) | A | A | A | A | A | A | A |
|  | 130° C. Viscosity (Pa·s) | 1100 | 139000 | 467000 | 628000 | 5220 | 5220 | 5220 |
| Resin Sheet B | Formulation | Sheet 10 | Sheet 10 | Sheet 10 | Sheet 10 | Sheet 8 | Sheet 14 | Sheet 15 |
|  | Bx (mm) | 20 | 20 | 20 | 20 | 20 | 20 | 20 |
|  | By (mm) | 20 | 20 | 20 | 20 | 20 | 20 | 20 |
|  | Bz (mm) | 0.12 | 0.12 | 0.12 | 0.12 | 0.12 | 0.12 | 0.12 |
|  | Condition (2) | A | A | A | A | A | A | A |
|  | 130° C. Viscosity (Pa·s) | 55 | 55 | 55 | 55 | 16 | 333 | 1186 |
| Resin leakage |  | B | A | A | A | A | A | A |
| Undefilling property |  | A | B | B | B | B | B | B |

TABLE 5

|  |  | Example |  |  |  |  |  | Comparative Example |  |
|---|---|---|---|---|---|---|---|---|---|
|  |  | 9 | 10 | 11 | 12 | 13 | 14 | 8 | 9 |
| Resin Sheet A | Formulation | Sheet 3 | Sheet 3 | Sheet 3 | Sheet 3 | Sheet 3 | Sheet 3 | Sheet 3 | Sheet 3 |
|  | Ax (mm) | 60 | 50 | 40 | 30 | 60 | 60 | 27 | 60 |
|  | Ay (mm) | 60 | 50 | 40 | 30 | 60 | 60 | 27 | 60 |
|  | Az (mm) | 0.4 | 0.4 | 0.4 | 0.4 | 0.05 | 0.4 | 0.4 | 0.4 |
|  | Condition (1) | A | A | A | A | A | A | B | A |
|  | 130° C. Viscosity (Pa·s) | 5220 | 5220 | 5220 | 5220 | 5220 | 5220 | 5220 | 5220 |
| Resin Sheet B | Formulation | Sheet 10 | Sheet 10 | Sheet 10 | Sheet 10 | Sheet 10 | Sheet 10 | Sheet 10 | Sheet 10 |
|  | Bx (mm) | 20 | 20 | 20 | 20 | 20 | 40 | 20 | 10 |
|  | By (mm) | 20 | 20 | 20 | 20 | 20 | 40 | 20 | 10 |
|  | Bz (mm) | 0.12 | 0.12 | 0.12 | 0.12 | 0.12 | 0.12 | 0.12 | 0.12 |
|  | Condition (2) | A | A | A | A | A | A | A | B |
|  | 130° C. Viscosity (Pa·s) | 55 | 55 | 55 | 55 | 55 | 55 | 55 | 55 |
| Resin leakage |  | A | A | A | A | A | A | B | A |
| Undefilling property |  | A | A | A | A | A | A | B | B |

It is seen from the results in the Tables above that in Examples 1 to 14 using a sheet A and a sheet B satisfying specific viscosity and specific size conditions, encapsulation with good underfilling performance and no resin leakage can be attained.

On the other hand, in Comparative Example 1 where the viscosity of the sheet A was less than the lower limit specified in the present invention, the sheet A itself caused resin leakage. In Comparative Examples 2 to 4 where the viscosity of the sheet A exceeded the upper limit specified in the present invention, the sheet A was not softened even when heated and failed in playing the part of a jig for preventing resin leakage, and the underfilling performance by the sheet B was unsuccessful. In Comparative Example 5 where the viscosity of the sheet B is less than the lower limit specified in the present invention, the sheet B having tack property readily caught air when being disposed on electronic parts and the air moved to the underfill portion during encapsulation to cause unsuccessful underfilling. In Comparative Examples 6 and 7 where the viscosity of the sheet B exceeds the upper limit specified in the present invention, the resin could not flow into the underfill portion and the underfilling performance was poor. In Comparative Examples 8 and 9 where the sheet A and the sheet B satisfy the specific viscosities specified in the present invention but do not satisfy the size conditions, the underfilling performance and the like were unsuccessful.

While the invention has been described in detail with reference to specific embodiments thereof, it will be apparent to one skilled in the art that various changes and modifications can be made therein without departing from the spirit and scope thereof.

Incidentally, the present application is based on Japanese Patent Application No. 2010-198623 filed on Sep. 6, 2010, and the contents are incorporated herein by reference.

All references cited herein are incorporated by reference herein in their entirety.

Also, all the references cited herein are incorporated as a whole.

Description of Reference Numerals and Signs
Ax Length (mm) in the X-axis direction of the sheet A
Ay: Length (mm) in the Y-axis direction of the sheet A,
Az: Thickness (mm) of the sheet A
t1: Thickness (mm) of electronic parts
t2: Height (mm) of the electrode part for connection of the electronic part
P: Length (mm) in the X direction of the electronic parts-mounting area
Q: Length (mm) in the Y direction of the electronic parts-mounting area
n: Number of electronic parts encapsulated
Vc: Volume ($mm^3$) per one electronic part
Bx: Length (mm) in the X-axis direction of the sheet B
By: Length (mm) in the Y-axis direction of the sheet B
Bz: Thickness (mm) of the sheet B
Vb: Total volume ($mm^3$) of bumps mounted on one electronic part
1: Upper press plate
2: Chamber
3: Package substrate
4: Lower press plate
5: Electronic part
6: Electrode part (bump) for connection of the electronic part
7: Sheet A
8: Sheet B
9: Encapsulating resin layer

What is claimed is:

1. A method for manufacturing an electronic parts device, said method comprising:

disposing a plurality of electronic parts in an array on a package substrate, and then stacking, in order, a thermosetting resin composition sheet B and a thermosetting resin composition sheet A on an electronic parts-mounting area of the package substrate while arranging the center and XY-plane direction of the electronic parts-mounting area to substantially agree with the centers and XY-plane directions of both the sheets A and B;

heating the package substrate which holds this arrangement state at a molding temperature selected from the range of 70 to 150° C. in a chamber under reduced pressure to cause an end part of an entire circumference of the sheet A to be softened and sag into contact with the package substrate and tightly closing a space surrounded by the entire circumference of the sheet A;

pressing the sheet A covering the sheet B and the electronic parts in the sagged state;

releasing the pressure in the chamber to perform underfilling of the electronic parts by a melt of the sheet B in the closed space formed between the sheet A and the package substrate;

after the underfilling, thermally curing the resin compositions of both the sheets A and B to obtain an electronic parts device assembly where the plurality of electronic parts on the package substrate are resin-encapsulated; and dicing the electronic parts device assembly to obtain each discrete electronic parts device;

wherein, the thermosetting resin composition sheet A having a viscosity at the molding temperature of from 2,000 to 50,000 Pa·s and having a dimension satisfying the following condition I:

$$Ax > P + 8$$

$$Ay > Q + 8$$

in which Ax is a length in an X-axis direction of the sheet A, Ay is an length in a Y-axis direction of the sheet A, P is a length in an X direction of the electronic parts-mounting area, and Q is a length in a Y direction of the electronic parts-mounting area, wherein, the thermosetting resin composition sheet B having a viscosity at the molding temperature of from 20 to 250 Pa·s and having a dimension satisfying the following condition II:

$$Ax \geq Bx > P \times 0.8$$

$$Ay \geq By > Q \times 0.8$$

in which Bx is a length in an X-axis direction of the sheet B, By is a length in a Y-axis direction of the sheet B, wherein all the lengths of the sheets A and B and of the parts-mounting area are measured in millimeter (mm).

2. The method for manufacturing an electronic parts device according to claim 1, wherein the dimension of the sheet A satisfies the following condition III:

$$t1 + t2 + 40 + P > Ax > t1 + t2 + 8 + P$$

$$t1 + t2 + 40 + Q > Ay > t1 + t2 + 8 + Q$$

$$(t1 + 0.5) - [(nxVc)/(PxQ)] > Az > t1 - [(nxVc)/(PxQ)]$$

in which Az is a thickness (mm) of the sheet A, t1 is a thickness of electronic parts, t2 is a height of the electrode part for connection of the electronic part, Vc is a volume per one electronic part, and n is the number of electronic parts encapsulated, wherein all the dimensions of the sheet A, electronic parts, electrode part, and parts-mounting area are measured in millimeter (mm).

3. The method for manufacturing an electronic parts device according to claim 1, wherein the dimension of the sheet B satisfies the following condition IV:

$$Ax \geq Bx > P \times 0.8$$

$$Ay \geq By > Q \times 0.8$$

$$\{[PxQx(t1+t2) - n(Vc+Vb)]/(PxQ)\} + 0.1 > Bz > (t2x PxQ - Vbxn)/(PxQ)$$

in which Bz is a thickness of the sheet B, t1 is a thickness of electronic parts, t2 is a height of the electrode part for connection of the electronic part, Vb is total volume of bumps mounted on one electronic part, Vc is a volume per one electronic part, and n is the number of electronic parts encapsulated, wherein all the dimensions of the sheet B, electronic parts, electrode part, parts-mounting area, and bumps are measured in millimeter (mm).

4. The method for manufacturing an electronic parts device according to claim 1, wherein the reduced pressure in the chamber is in a range of from 0.01 to 5 kPa.

5. The method for manufacturing an electronic parts device according to claim 1, wherein the pressing step is performed under a pressure of 50 to 1,000 kPa.

6. The method for manufacturing an electronic parts device according to claim 1, wherein a temperature at which both the sheets A and B are thermally cured is a temperature exceeding 150° C.

7. The method for manufacturing an electronic parts device according to claim 1, wherein the resin composition sheet A comprises an epoxy resin composition which comprises the following components (a) to (d):
 (a) an epoxy resin having a viscosity at 25° C. of 1.0 to 10.0 Pas,
 (b) a curing agent,
 (c) an inorganic filler comprising the following components (c1) to (c3) in which a total content of the components (c2) and (c3) is from 2 to 60 parts by weight per 100 parts by weight of the component (c1),
   (c1) an inorganic filler having an average particle diameter of 5 to 20 μm,
   (c2) an inorganic filler having an average particle diameter of 1 to 3 μm, and
   (c3) an inorganic filler having an average particle diameter of 0.3 to 0.8 μm, and
 (d) a flexibility-imparting agent.

8. The method for manufacturing an electronic parts device according to claim 1, wherein the resin composition sheet B comprises an epoxy resin composition which comprises the following components (e) to (h):
 (e) a mixture of an epoxy resin having a softening point of 60 to 130° C. and a liquid epoxy resin,
 (f) a curing agent,
 (g) an inorganic filler having an average particle diameter of 0.3 to 3 μm, and
 (h) a flexibility-imparting agent.

9. A resin composition sheet for electronic parts encapsulation, which is used in the method according to claim 1, wherein the resin composition sheet is a sheet set comprising the sheet A and the sheet B.

10. A resin composition sheet for electronic parts encapsulation, which is used in the method according to claim 1, wherein the resin composition sheet is obtained by stacking and integrating the sheet A and the sheet B.

* * * * *